United States Patent

Sawairi et al.

[15] 3,702,968

[45] Nov. 14, 1972

[54] AM-FM RADIO RECEIVER HAVING NOVEL RF INPUT CIRCUIT

[72] Inventors: Hitoshi Sawairi, Hirakata; Yoshio Kurihara, Osaka; Kazuhiko Takahashi, Hirakata; Yoshihiko Hayakawa, Nishinomiya; Yukio Hataya, Neyagawa, all of Japan

[73] Assignee: Matsushita Electric Industrial Co., Ltd., Osaka, Japan

[22] Filed: Sept. 10, 1970

[21] Appl. No.: 71,081

[30] Foreign Application Priority Data

Sept. 17, 1969 Japan ......................44/75026
Sept. 19, 1969 Japan ......................44/76041
Sept. 20, 1969 Japan ......................44/75559

[52] U.S. Cl...................................325/315, 325/463
[51] Int. Cl...............................................H04b 1/06
[58] Field of Search......325/315, 316, 317, 452, 458, 325/462, 463

[56] References Cited

UNITED STATES PATENTS

| | | | |
|---|---|---|---|
| 2,561,087 | 7/1951 | Anderson | 325/315 |
| 2,812,433 | 11/1957 | Stolk | 325/463 |
| 3,172,040 | 3/1965 | Schultz | 325/316 |
| 3,201,695 | 8/1965 | Mason et al. | 325/315 |
| 3,360,730 | 12/1967 | Sims | 325/315 |

*Primary Examiner*—Robert L. Griffin
*Assistant Examiner*—Barry Leibowitz
*Attorney*—Stevens, Davis, Miller & Mosher

[57] ABSTRACT

An AM-FM radio receiver comprises a high-frequency amplifying circuit for signals of both FM and AM frequency bands, signal transmission means including first and second signal channels which permit FM and AM high-frequency signals to pass therethrough respectively, and a frequency mixing circuit connected to the high-frequency amplifying circuit through the signal transmission means so as to receive an output signal of the high-frequency amplifying circuit selectively passing through the first and second signal channels in case of FM reception and AM reception respectively.

7 Claims, 2 Drawing Figures

H. SAWAIRI,
Y. KURIHARA,
K. TAKAHASHI,
Y. HAYAKAWA
AND Y. HATAYA
INVENTORS

BY Stevens, Davis, Miller & Mosher
ATTORNEYS

AM-FM RADIO RECEIVER HAVING NOVEL RF INPUT CIRCUIT

This invention relates to an AM-FM radio receiver.

An AM-FM radio receiver is generally well-known, which is constructed so that a frequency converting transistor for AM can be used as an intermediate frequency amplifying transistor for FM. However, in such a radio receiver, it is usual that a high-frequency amplifying transistor is not provided and its sensitivity in case of AM reception is not always satisfactory. A radio receiver is also well-known, which is provided with high-frequency amplifying transistors for AM and FM, respectively. However such a radio receiver is remarkably complex in the whole construction thereof and very troublesome in the manufacturing and assembly because it is necessary that not only high-frequency amplifying transistors but also frequency converting transistors be provided respectively for AM and FM.

A radio receiver according to this invention aims at overcoming the above-mentioned defects of the prior art and is so constructed that a frequency converting transistor as well as a high-frequency amplifying transistor can be used both for AM and FM.

The object of this invention is to provide a radio receiver so constructed that a high-frequency amplifying transistor and a frequency mixing transistor which are provided for FM can be used as a high-frequency amplifying transistor and a frequency mixing transistor for AM.

Another object of this invention is to provide a radio receiver so constructed that the whole circuit construction, especially the frequency mixing circuit construction thereof is simplified and the switching of AM and FM can be easily carried out without any complex mechanical switch.

Still another object of this invention is to provide a radio receiver so constructed that a high-frequency amplified output can be readily obtained in both cases of AM and FM reception.

Figure 1:
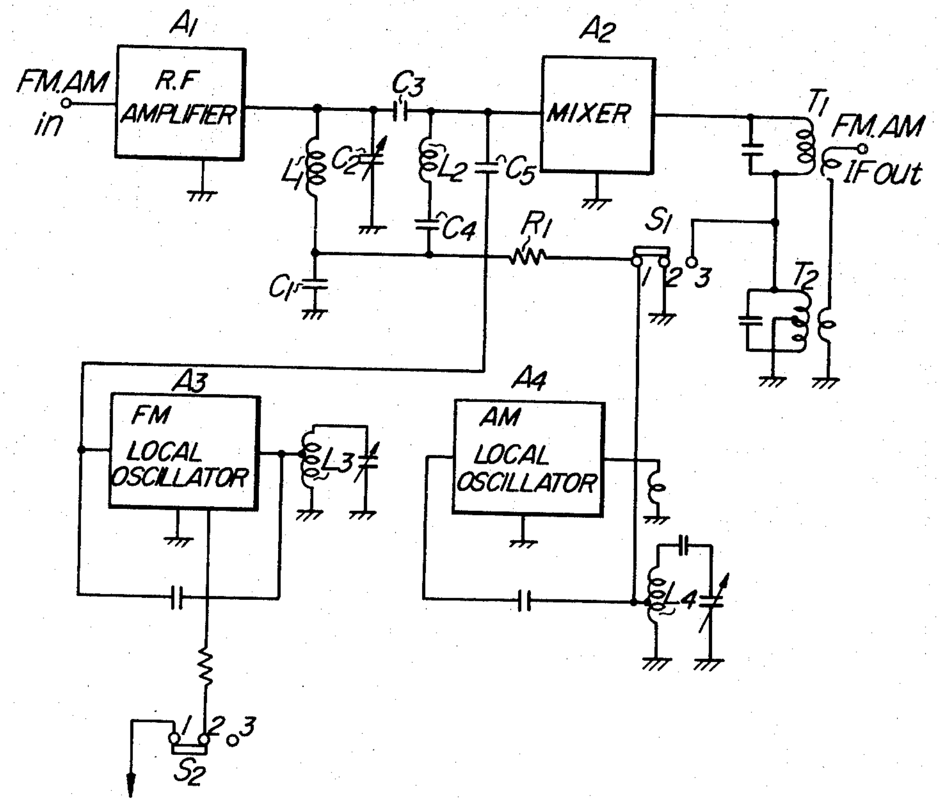
Figure 2:
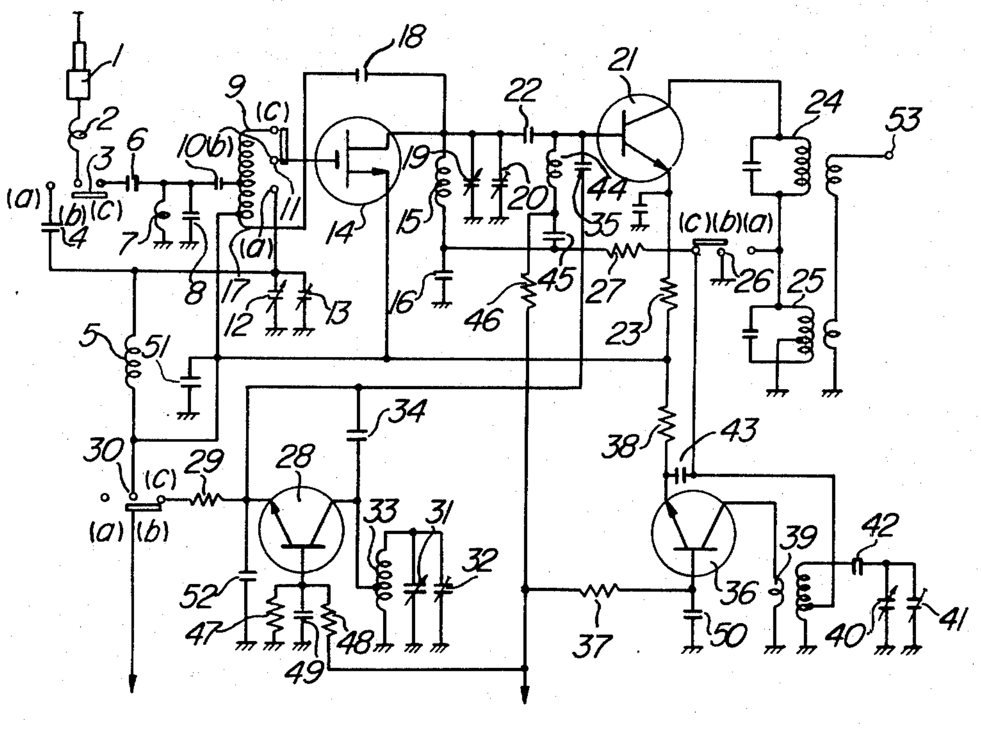

Explanation will be made of an embodiment of a radio receiver according to the present invention with reference to the accompanying drawings, in which;

FIG. 1 is a schematic diagram showing the electrical connection of an embodiment of an AM-FM radio receiver according to this invention, and FIG. 2 is a diagram showing the specific electrical connection of the same embodiment as in FIG. 1.

FIG. 1 is a schematic diagram showing the electrical connection of an embodiment of an AM-FM radio receiver according to this invention. In the figure, $A_1$ designates a high-frequency amplifying circuit both for AM and FM, $A_2$ a frequency mixing circuit both for AM and FM, $A_3$ a local oscillation circuit for FM and $A_4$ a local oscillation circuit for AM. $L_1$ and $C_2$ designate a coil and a capacitor, respectively, which constitute an FM tuning circuit, one end of the coil being grounded through a capacitor $C_1$.

A junction point between the coil $L_1$ and the capacitor $C_1$ is connected through a resistor $R_1$ to the output side of the local oscillation circuit $A_4$ for AM. $L_2$, $C_4$ and $C_1$ constitute a trap circuit which resonates at an FM intermediate frequency and elevate the stability for alternating current of the circuit. $C_3$ and $C_5$ designate coupling capacitors and $T_1$ and $T_2$ designate intermediate frequency transformers for AM and FM, respectively. $S_1$ and $S_2$ designate switches for switching of AM and FM which operate in interlocking relation with each other, the movable contact thereof being thrown onto the terminal 3 thereof in case of AM reception and onto the terminal 1 in case of FM reception.

Explanation will now be made in case of receiving FM broadcasting with reference to FIG. 1.

When receiving FM broadcasting, the movable contacts of the switches $S_1$ and $S_2$ are both thrown onto the terminal 1. Therefore, a supply voltage is applied to the FM local oscillation circuit $A_3$ through the switch $S_2$ so that the FM local oscillation circuit $A_3$ is brought into an operating state.

An FM high-frequency signal amplified by the high-frequency amplifying circuit $A_1$ is applied to the FM tuning circuit which consists of the coil $L_1$ and a variable capacitor $C_2$ and in which a desired signal is tuned. The tuned signal is applied to the frequency mixing circuit $A_2$ together with an output of the FM local oscillation circuit $A_3$ through the coupling capacitor $C_3$ so that an FM intermediate frequency signal appears at the output of the circuit $A_2$. This FM intermediate frequency signal is taken out from the FM intermediate frequency transformer $T_2$.

In this case, the AM local oscillation circuit $A_4$ is in a non-operating state because the output terminal thereof is grounded through the switch $S_1$. And, in this case, the FM tuning circuit consisting of the coil $L_1$ and the variable capacitor $C_2$ functions as a load of the high-frequency amplifying circuit $A_1$.

In the next place, when receiving AM broadcasting, the movable contacts of both switches $S_1$ and $S_2$ are thrown on the terminals 3 thereof, and therefore the FM local oscillation circuit $A_3$ is in a non-operating state and the AM local oscillation circuit $A_4$ is brought into an operating state.

When receiving AM broadcasting, because the impedances of the coil $L_1$ constituting the FM tuning circuit and the coil $L_2$ constituting the trap circuit become very low, an AM high-frequency signal amplified by the high-frequency amplifying circuit is applied to the frequency mixing circuit $A_2$ together with an output of the AM local oscillation circuit $A_4$ through the coil $L_1$, the capacitor $C_4$ and the coil $L_2$. Therefore, an AM intermediate frequency signal appears at the output of the frequency mixing circuit $A_2$. This AM intermediate frequency signal is taken from the AM intermediate frequency transformer $T_1$.

In this case, the capacitor $C_1$, the resistor $R_1$ and an oscillation coil $L_4$ constituting the AM local oscillation circuit $A_4$ function as a parallel load of the high-frequency amplifying circuit. Therefore, it is preferable that, in the trap circuit constituted by the coil $L_2$ and the capacitors $C_1$ and $C_4$, the capacitance of the capacitor $C_1$ is selected to have a sufficiently low value as compared with the capacitance of the capacitor $C_4$ so as to decrease the damping of the output of the AM local oscillation circuit so that the load does not become extremely low in the impedance thereof as a load of the high-frequency amplifying circuit $A_1$. Further, it is desired that the capacitance of the capacitor $C_4$ is selected to have a large value so that it does not assume a large impedance for an AM local oscillation output and an AM high-frequency output, and the coil $L_2$ is so selected that the impedance thereof becomes remarkably low for a signal of AM receiving frequency.

FIG. 2 shows more concretely an AM-FM radio receiver of this invention. In the figure, numeral 1 designates a whip antenna both for AM and FM, the whip antenna 1 being connected to the neutral terminal (b) of an AM-FM change-over switch 3 through a coil 2 which functions as a choke for FM frequency band in case of AM reception.

The AM terminal (*a*) of the change-over switch 3 is connected to one end of a ferrite-rod antenna 5 through a blocking capacitor 4, and the FM terminal (*c*) is connected to one end of a parallel resonance circuit constituted by a coil 7 and a capacitor 8, of which the other end is grounded, through a capacitor 6 which resonates with FM frequency band together with the above-mentioned coil 2.

Numeral 9 designates a step-up coil, the intermediate tap thereof being connected to the output side of the above-mentioned capacitor 6 through a capacitor 10, one end thereof being connected to the FM terminal (*c*) of an AM-FM change-over switch 11, the other end being connected directly to the other end of the ferrite-rod antenna 5 and to a —B power supply.

A junction point between the ferrite-rod antenna 5 and the blocking capacitor 4 is connected to the AM terminal (*a*) of the AM-FM change-over switch 11, to which AM terminal (*a*) are connected a variable capacitor 12 and a trimmer capacitor 13 which constitute together with the ferrite-rod antenna 5 a tuning circuit in case of AM reception.

Numeral 14 designates a high-frequency amplifying transistor both for AM and FM, the gate thereof being connected to the intermediate terminal (*b*) of the AM-FM change-over switch 11, the source being directly connected to the —B power supply, the drain being grounded through a coil 15 and a capacitor 16 of comparatibly low capacitance, which constitute a tuning circuit in case of FM reception.

A neutralizing capacitor 18 is connected between a coil 17 provided in sequence to the step-up coil 9 and the drain of the high-frequency amplifying transistor 14. A variable capacitor 19 and a trimmer capacitor 20 which constitute together with the above-mentioned coil 15 a tuning circuit in case of FM reception are connected between the drain of the high-frequency amplifying transistor 14 and the ground.

Numeral 21 designates a frequency mixing transistor both for AM and FM, the base thereof being connected to the drain of the above-mentioned transistor through a coupling capacitor 22, the emitter being connected to the —B power supply through a bias resistor 23, the collector being grounded through a circuit in series connection of an intermediate frequency transformer 24 for AM and an intermediate frequency transformer 25 for FM.

A junction point between the intermediate transformer 24 for AM and the intermediate transformer 25 for FM is connected to the AM terminal (*a*) of an AM-FM change-over switch 26 of which the neutral terminal (*b*) is grounded, and the FM terminal (*c*) of the AM-FM change-over switch 26 is connected to a junction point between the coil 15 and the capacitor 16 through a load resistor 27. Numeral 28 designates an FM oscillation transistor, the emitter thereof being connected to the FM terminal (*c*) of the AM-FM change-over switch 30 of which the neutral terminal (*b*) is connected to the —B power supply through a resistor 29, the collector being connected to the intermediate tap of a coil 33 which constitutes a resonance circuit together with a variable capacitor 31 and a trimmer capacitor 32. A feedback capacitor 34 is connected between the collector and the emitter thereof. The emitter is connected to the base of the frequency mixing transistor 21 through a pouring capacitor 35. Numeral 36 designates an AM oscillation transistor, the base and the emitter thereof being connected to a bias power supply of which the voltage is somewhat higher than that of the —B power supply through a bias resistor 37 and to the —B power supply through a bias resistor 38 respectively, the collector being grounded through the primary winding of an oscillation coil 39. The secondary winding of the oscillation coil 39 is connected to a variable capacitor 40 and a trimmer capacitor 41 through a blocking capacitor 42 and constitutes an oscillation circuit together with them. The intermediate tap of the secondary winding is connected directly to the FM terminal (*c*) of the AM-FM change-over switch 26 and connected to the emitter of the transistor 36 through a feedback capacitor 43.

Numeral 44 designates a coil, one end thereof being connected to a point between the coil 15 and capacitor 16 through a capacitor 45 of large capacitance, which coil constitutes an intermediate frequency trap circuit resonating at an FM intermediate frequency together with the capacitor 16 of low capacitance and causes the base of the frequency mixing transistor 21 to be high-frequency wise grounded in case of FM reception. Numeral 46 designates a bias resistor connected between a junction point between the coil 44 and the capacitor 45 and the bias power supply, numerals 47 and 48 designate base bias resistors of the FM oscillation transistor 28, 49 and 50 by-pass capacitors connected between the base of the FM oscillation transistor 28 and the ground and between the base of the AM oscillation transistor 36 and the ground, respectively, numeral 51 designates a capacitor connected between the —B power supply and the ground, and 52 a capacitor connected between the emitter of the FM oscillation transistor 28 and the ground.

Explanation will be made in the above-mentioned embodiment when receiving FM broadcasting.

When receiving FM broadcasting all movable contacts of the AM-FM change-over switches 3, 11, 26 and 30 are thrown onto the respective FM terminals (*c*) thereof. As a result, the AM tuning circuit consisting of the ferrite-rod antenna 5 and the variable capacitor 12 and the trimmer capacitor 13 connected in parallel therewith is separated from the gate of the high-frequency amplifying transistor 14, the intermediate tap of the coil 39 constituting the AM oscillation circuit is grounded resulting in no operation of the AM oscillation circuit, and therefore AM broadcasting cannot be received at all. An FM high-frequency signal received on the whip antenna 1 is applied to the intermediate tap of the step-up coil 9 through the coil 2 and capacitors 6 and 10 and is fed to a circuit comprising the inductance of a part of the coil 9 between the intermediate tap thereof and the —B power supply and the capacitance of the capacitors 10 and 51, which resonates with the FM signal. The FM signal is boosted by the remaining part of the coil 9 and then applied to the gate of the high-frequency amplifying transistor 14 through the AM-FM change-over switch 11. The FM high-frequency signal applied to the gate of the high-frequency amplifying transistor 14 is further amplified in the high-frequency amplifying transistor 14 and an output thereof is fed to the FM tuning circuit consisting of the coil 15, variable capacitor 19 and the trimmer capacitor 20. A desired FM signal is tuned in this circuit and the tuned FM signal is applied to between the base and the emitter of the frequency mixing transistor 21 through the coupling capacitor 22.

On the other hand, the oscillation transistor 28 constituting the FM oscillation circuit is brought into an operating state by means of the emitter thereof being connected to the —B power supply through the AM-FM change-over switch 30, and an oscillation output appears at the collector thereof, which possesses a frequency determined by the coil 33, the variable capacitor 31 and the trimmer capacitor 32. This oscillation output is fed to the base of the frequency mixing transistor 21 through the pouring capacitor 35. Therefore, there appears at the collector of the frequency mixing transistor 21 a signal of intermediate frequency produced by the oscillation output and the FM signal fed through the coupling capacitor 22. This signal is applied to the intermediate frequency transformer 25 and taken out from the output terminal 53 thereof.

In the next place, explanation will be made in the case when receiving AM broadcasting.

When receiving AM broadcasting, all movable contacts of the AM-FM change-over switches 3, 11, 26 and 30 are thrown onto the respective AM terminals (*a*) thereof. As a result, the whip antenna 1 is connected to one end of the ferrite-rod antenna 5 through the coil 2 and the capacitor 4 and the step-up coil 9 is separated from the high-frequency amplifying transistor 14. At the same time, the intermediate tap of the secondary winding of the resonant coil 39 constituting the AM local oscillation circuit and the emitter of the FM oscillation transistor 28 constituting the FM local oscillation circuit are separated respectively from the ground and the —B power supply, and the FM intermediate frequency transformer 25 is short-circuited by the AM-FM change-over switch 26. Therefore, FM broadcasting cannot be received.

An AM signal received on the whip antenna 1 or the ferrite-rod antenna 5 is applied to the gate of the high-frequency amplifying transistor 14 by means of the ferrite-rod antenna 5, variable capacitor 12 and the trimmer capacitor 13 through the AM-FM change-over switch 11. This AM signal is amplified by the high-frequency amplifying transistor 14 and applied to the base of the frequency mixing transistor 21 through the coil 15, the capacitor 45 of large capacitance and the I.F. trapping coil 44.

On the other hand, when the intermediate tap of the resonant coil 39 constituting an AM local oscillation circuit is separated from the ground, the AM local oscillation circuit resonates at a frequency determined by the resonant coil 39, the variable capacitor 40, the trimmer capacitor 41 and the tracking capacitor 42, and an output of this frequency appears at the intermediate tap of the coil 39. This output is applied to the base of the frequency mixing transistor 21 through the resistor 27, the capacitor 45 and the coil 44. Therefore, the frequency mixing transistor 21 operates in a predetermined fashion so that an AM intermediate frequency signal is produced at the emitter thereof. This AM intermediate frequency signal is fed to the AM intermediate frequency transformer 24 and taken out from the output terminal 53 thereof.

In addition, in the above-described embodiment, the coil 15, the variable capacitor 19 and the trimmer capacitor 20 which constitute the FM tuning circuit functions as a load for a high-frequency amplified FM output in case of FM reception while the resistor 27 functions as a load for a high-frequency amplified AM output in case of AM reception.

As apparent from the explanation of the above embodiment, according to the present invention, the high-frequency amplifying circuit and the frequency mixing circuit can be used both when receiving signals of AM AND FM frequency bands, and further the AM-FM changing can be carried out exactly and precisely without any complicated mechanical switch prior to the frequency mixing circuit, and therefore the whole structure of the radio receiver can be remarkably simplified. Furthermore, according to this invention, the sensitivity in case of AM reception can be remarkably improved even without a particular high-frequency amplifying circuit, and accordingly distinguished advantages in characteristic can be derived. That is, an AM-FM radio receiver of high selectivity can be accomplished by the fact that a field effect transistor is used as the high-frequency amplifying transistor 14, a high Q value resulting from the combination of the input impedance of the field effect transistor and the impedance-up of the input circuit thereof can be obtained by such a construction that a resultant signal by boosting the FM high-frequency signal by the step-up coil 9 and the AM high-frequency signals are changed over by the switch 11 so that either of the two is applied to the gate of the above-mentioned transistor. And also, an AM-FM radio receiver of high sensitivity as a whole can be accomplished by the fact that an output per se from the high-frequency amplifying transistor 14 becomes high because a circuit comprising the inductance of the coil between the intermediate tap of the coil 9 and the —B power supply and the capacitance of the coupling capacitor 10 resonates with the received high-frequency signals and these signals are boosted by the step-up coil 9, by constructing a tuning circuit which consists of the coupling capacitor 10 connected to the intermediate tap of the step-up coil 9 and the coil between the intermediate tap of the above-mentioned coil 9 and the —B power supply and which tunes to the center frequency of the received frequency band and by so constructing that a voltage appearing between the end terminals of the step-up coil 9 is applied to between the gate and the source of the high-frequency amplifying transistor 14.

What is claimed is:

1. An AM-FM radio receiver comprising;

a high-frequency amplifying circuit for amplifying received signals in both the AM and FM frequency bands;

signal transmission means including a first signal channel comprising first impedance means having a high impedance for frequencies in the AM band for permitting an FM high-frequency signal to pass therethrough, and a second signal channel comprising a second impedance means having a high impedance for frequencies in the FM band for permitting an AM high-frequency signal to pass therethrough, said first or second signal channels being selected without switching therebetween when an FM or AM signal appears at the output of said high-frequency amplifying circuit;

a frequency mixing circuit connected to said high-frequency amplifying circuit through said signal transmission means so as to receive an output signal from said high-frequency amplifying circuit selectively passing through said first and second signal channels in case of FM reception and AM reception respectively;

means for applying an output signal of an FM local oscillation circuit having a first oscillator to the input of said frequency mixing circuit;

means for applying an output signal of an AM local oscillation circuit having a second oscillator to the input of said frequency mixing circuit; and means for selectively actuating said FM local oscillation circuit and AM local oscillation circuit in case of FM reception and AM reception respectively.

2. An AM-FM radio receiver according to claim 1, wherein said signal transmission means consists of an FM tuning circuit connected to the output of said high-frequency amplifying circuit, an FM intermediate frequency trap circuit connected to the input of said frequency mixing circuit and a coupling capacitor connecting said two circuits with each other, and transmits high-frequency signals through said coupling capacitor in case of FM reception and through a coil constituting said FM tuning circuit and a coil constituting said FM intermediate frequency trap circuit in case of AM reception.

3. An AM-FM radio receiver according to claim 1, wherein said signal transmission means consists of a coil connected to the output of said high-frequency amplifying circuit, variable capacitors connected in parallel with said coil and constituting an FM tuning circuit together with said coil, a coil connected to the input of said frequency mixing circuit, a capacitor constituting an FM intermediate frequency trap circuit, which is connected to series with both last said coil and said coil constituting said FM tuning circuit, and a capacitor connected between the output of said high-frequency amplifying circuit and the input of said frequency mixing circuit, said coil and variable capacitor constituting said FM tuning circuit functioning as a load for FM high-frequency signals in case of FM reception, said capacitor constituting said FM intermediate frequency trap circuit functioning as a load for AM high-frequency signals in case of AM reception.

4. An AM-FM radio receiver according to claim 1, wherein the output of said high-frequency amplifying circuit is connected to the input of said frequency mixing circuit through a capacitor and connected to an oscillation coil constituting said AM local oscillation circuit through a coil constituting an FM tuning circuit and a severally provided resistor, and a junction point between said oscillation coil and said resistor and a junction point between an AM intermediate transformer and an FM intermediate transformer which are connected to the output of said frequency converting circuit are connected respectively to the FM terminal and the AM terminal of an AM-FM change-over switch the neutral terminal of which is grounded.

5. An AM-FM radio receiver according to claim 1, wherein said high-frequency amplifying circuit consists of a field effect transistor, an AM-FM change-over switch, the neutral terminal of said switch being connected to the gate of said transistor, the FM terminal and AM terminal of said switch are connected to one end of a step-up coil and an AM tuning circuit respectively, and a capacitor connected between an intermediate tap of said step-up coil and an antenna, which resonates at a frequency near a received signal frequency together with said step-up coil.

6. An AM-FM radio receiver wherein a coil and a variable capacitor which constitute an FM tuning circuit are connected to the output of a high-frequency amplifying circuit for amplifying both signals of the AM and FM frequency bands, said FM tuning circuit functioning as a load in case of FM reception, an FM high-frequency signal which appears across the terminals of said FM tuning circuit is applied to the input of a following frequency converting circuit together with an output of an FM local oscillation circuit so that a frequency converting is carried out, while an intermediate frequency trap circuit which is connected to the input of said frequency converting circuit and resonates at an FM intermediate frequency consists of a coil and a capacitor of low capacitance, said capacitor is connected in series with said coil constituting said FM tuning circuit, a resistor connected between a junction point between said capacitor and said coil and the input side of an AM local oscillation circuit functions as a load in case of AM reception, an AM high-frequency signal which appears across the terminals of said resistor is applied to the input of said frequency converting circuit together with an output of said AM local oscillation circuit through said coil constituting said intermediate frequency trap circuit so that a frequency converting is carried out.

7. An AM-FM radio receiver comprising;

an antenna circuit including an antenna;

a high-frequency amplifying circuit for amplifying signals in both the AM and FM frequency bands received by said antenna circuit;

signal transmission means including a first signal channel for permitting an FM high-frequency signal to pass therethrough, and a second signal channel for permitting an AM high-frequency signal to pass therethrough;

a frequency mixing circuit connected to said high-frequency amplifying circuit through said signal transmission means so as to receive an output signal of said high-frequency amplifying circuit selectively passing through said first and second signal channels in case of FM reception and AM reception respectively;

means for feeding an output signal of an FM local oscillation circuit having a first oscillator to the input of said frequency mixing circuit;

means for feeding an output signal of an AM local oscillation circuit having a second oscillator to the input of said frequency mixing circuit;

means for selectively actuating said FM and AM local oscillating circuits in case of FM reception and AM reception respectively;

a coil connected in series with said antenna, said coil being adapted to present a high impedance for a received signal in the FM frequency band and a relatively low impedance for a received signal in the AM frequency band respectively; and an AM-FM channel-over switch having first, second and third terminals, said first terminal being connected to the input of said high-frequency amplifying circuit through a capacitor constituting together with said coil a band-pass filter which allows a received signal in the FM frequency band to pass therethrough, said second terminal being connected to the output of said coil, said third terminal being connected directly to the input of said high-frequency amplifying circuit, said second terminal being adapted to be selectively connected to said first and third terminals in case of FM reception and AM reception respectively.

* * * * *